(12) United States Patent
Brounne et al.

(10) Patent No.: US 8,324,497 B2
(45) Date of Patent: Dec. 4, 2012

(54) LUMINESCENT SOLAR CONCENTRATORS

(75) Inventors: Marcel Brounne, Breda (NL); Huashan Wang, Pittsfield, MA (US)

(73) Assignee: SABIC Innovative Plastics IP B.V., Bergen op Zoom ( * ) Notice: Subject to any disclaimer, the term of this patent is extended or adjusted under 35 U.S.C. 154(b) by 785 days.

(21) Appl. No.: 12/255,140

(22) Filed: Oct. 21, 2008

(65) Prior Publication Data

US 2009/0126778 A1   May 21, 2009

Related U.S. Application Data

(60) Provisional application No. 60/989,229, filed on Nov. 20, 2007.

(51) Int. Cl.
*H01L 31/055* (2006.01)

(52) U.S. Cl. ........ 136/247; 136/246; 136/244; 136/256; 136/257; 438/64

(58) Field of Classification Search .................. None
See application file for complete search history.

(56) References Cited

U.S. PATENT DOCUMENTS

| | | | | |
|---|---|---|---|---|
| 4,097,308 A | * | 6/1978 | Klein et al. | ......... 136/251 |
| 4,144,097 A | | 3/1979 | Chambers et al. | |
| 4,149,902 A | | 4/1979 | Mauer et al. | |
| 4,153,813 A | | 5/1979 | Blieden et al. | |
| 4,164,432 A | * | 8/1979 | Boling | ......... 136/247 |
| 4,188,238 A | | 2/1980 | Boling | |
| 4,227,939 A | * | 10/1980 | Zewail et al. | ......... 136/247 |
| 4,488,047 A | | 12/1984 | Thomas | |
| 2006/0107993 A1 | * | 5/2006 | Wilhelm Krokoszinski et al. | ......... 136/247 |
| 2010/0000603 A1 | * | 1/2010 | Tsuzuki et al. | ......... 136/259 |

FOREIGN PATENT DOCUMENTS

| | | |
|---|---|---|
| DE | 102006000682 A1 | 7/2007 |
| WO | 2006088370 A2 | 8/2006 |
| WO | WO 2007/063860 * | 7/2007 |

OTHER PUBLICATIONS

PCT International Search Report for International Application No. PCT/US2008/083973.
DE102006000682A1, publication date Jul. 12, 2007, Inventor Aurich, Joachim, abstract.
Goetzberger, A et al: "Solar Energy Conversion With Florescent Collectors", Applied Physics, vol. 14, Oct. 1, 1977, pp. 123-139, XP009082077.

* cited by examiner

*Primary Examiner* — Jennifer Michener
*Assistant Examiner* — Jayne Mershon
(74) *Attorney, Agent, or Firm* — Richard M. Klein; Fay Sharpe LLP

(57) ABSTRACT

A luminescent solar concentrator comprises a primary waveguide and at least one photovoltaic cell. The primary waveguide has a curved surface which concentrates light on a perimeter. The photovoltaic cell is oriented at the perimeter so that it can both receive the concentrated light and receive direct light as well. A back sheet may be provided that provides structural support and protection. The perimeter may have the shape of a polygon where a photovoltaic cell is oriented along each edge. Modules and arrays of such units are also disclosed.

22 Claims, 12 Drawing Sheets

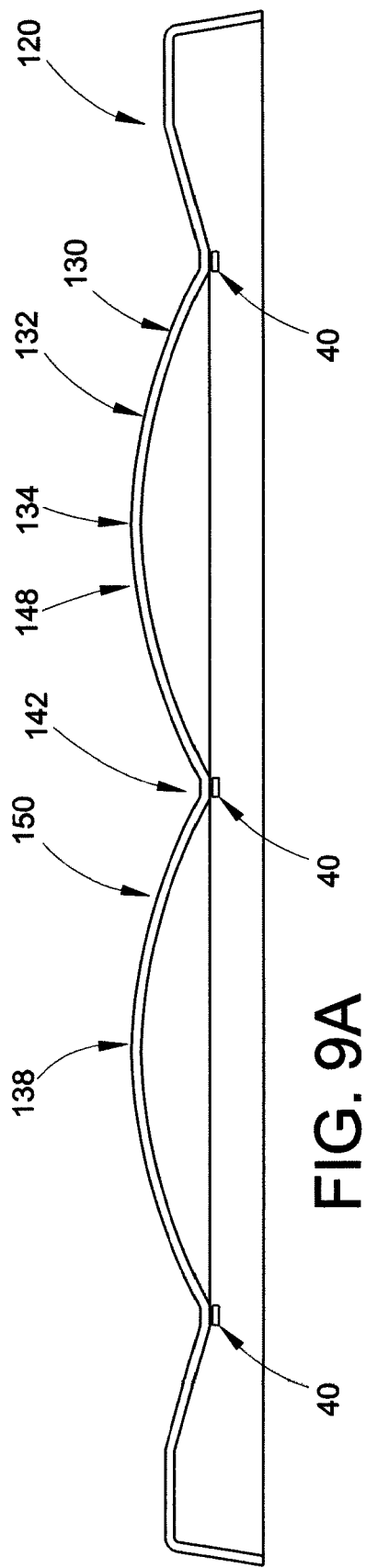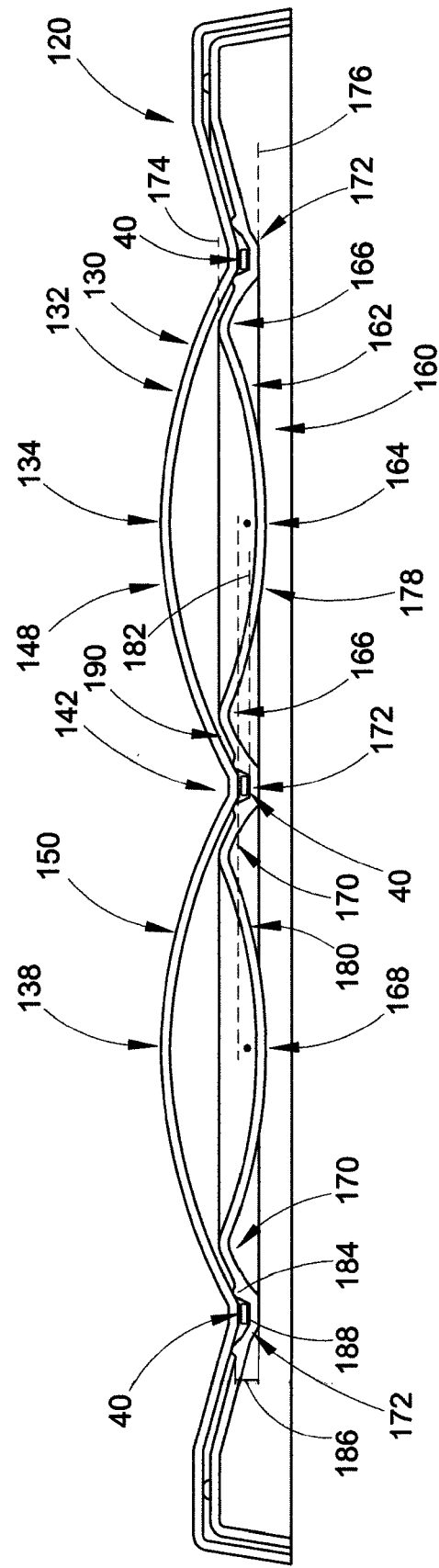

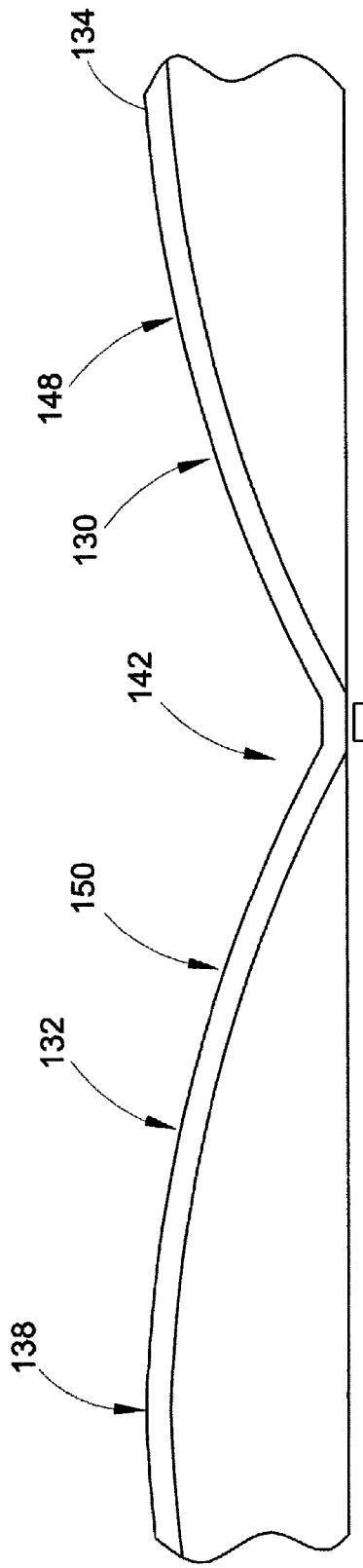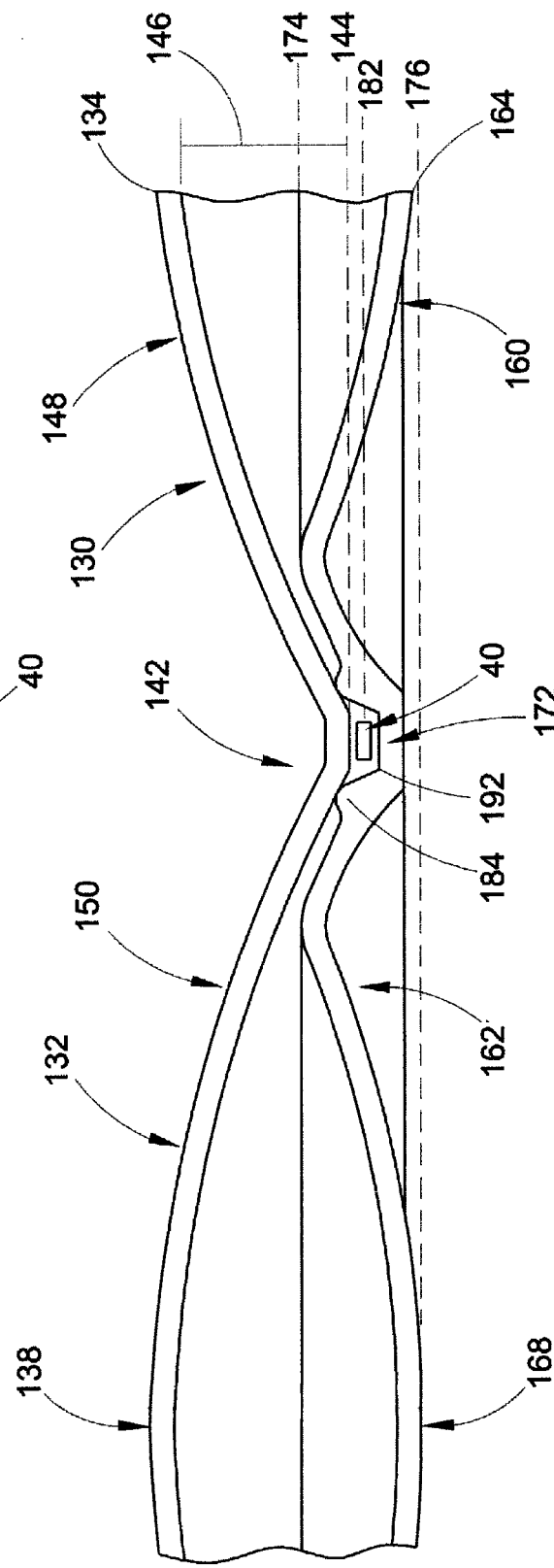

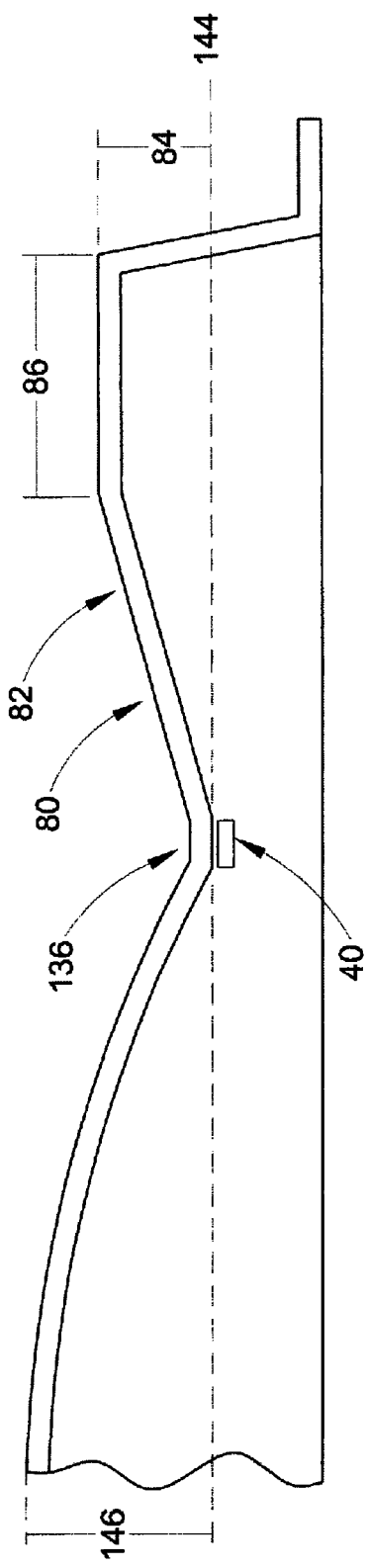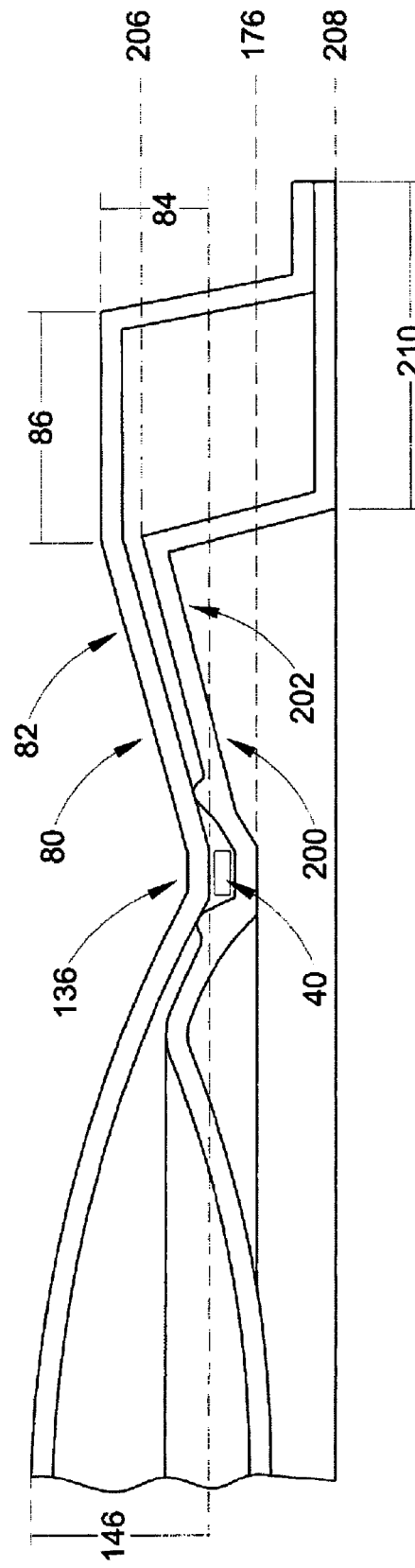

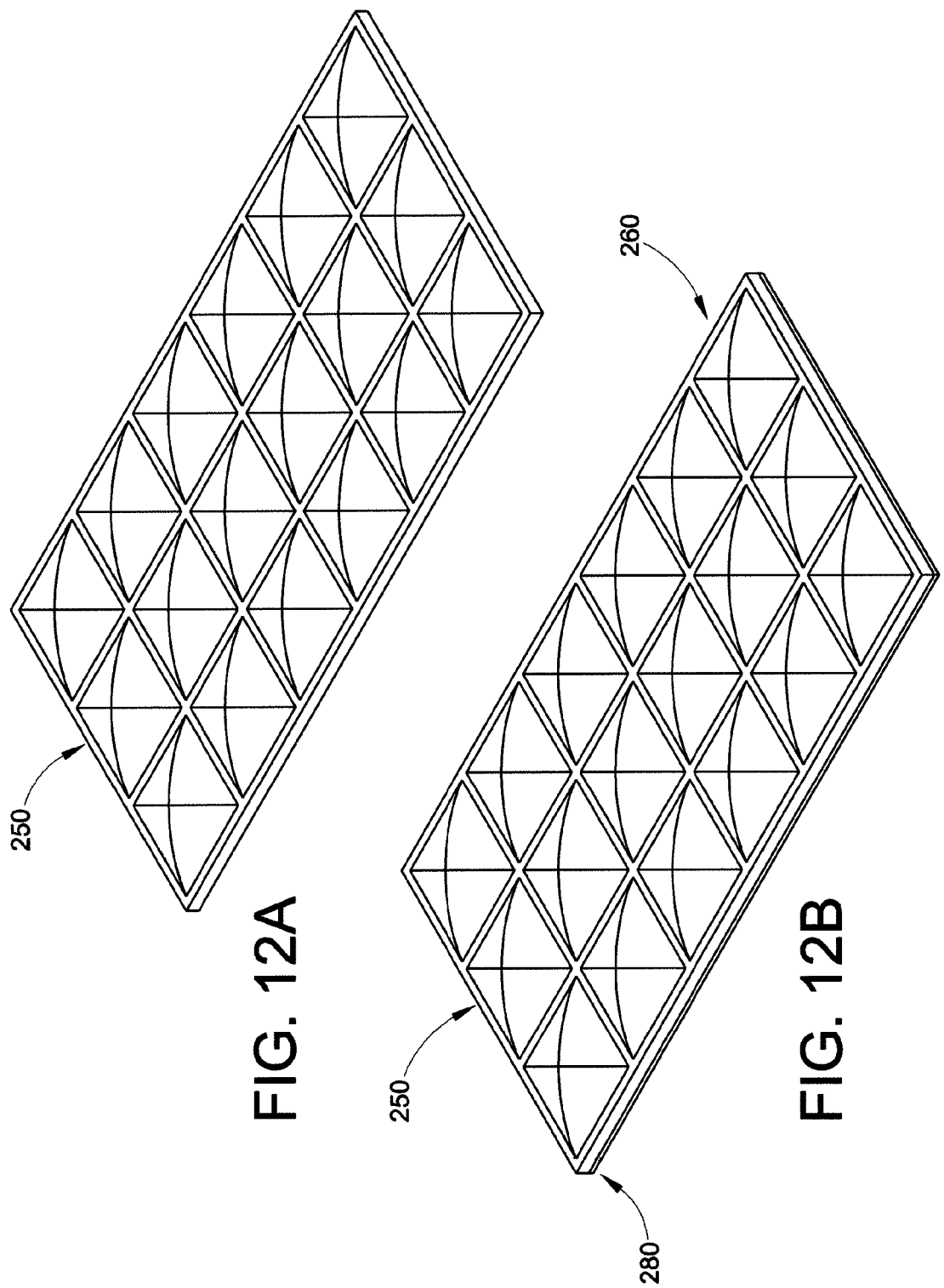

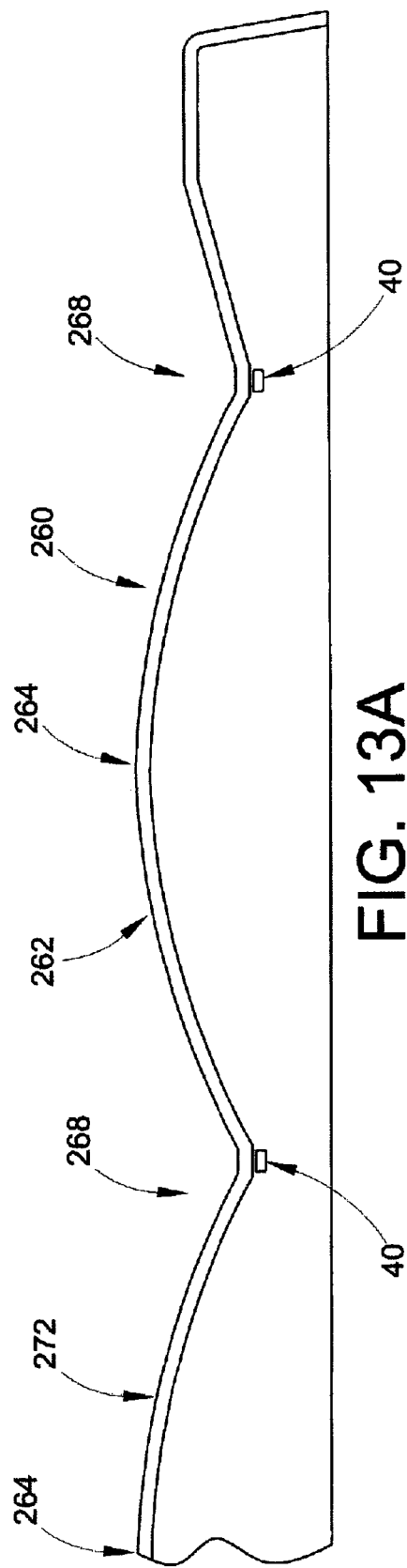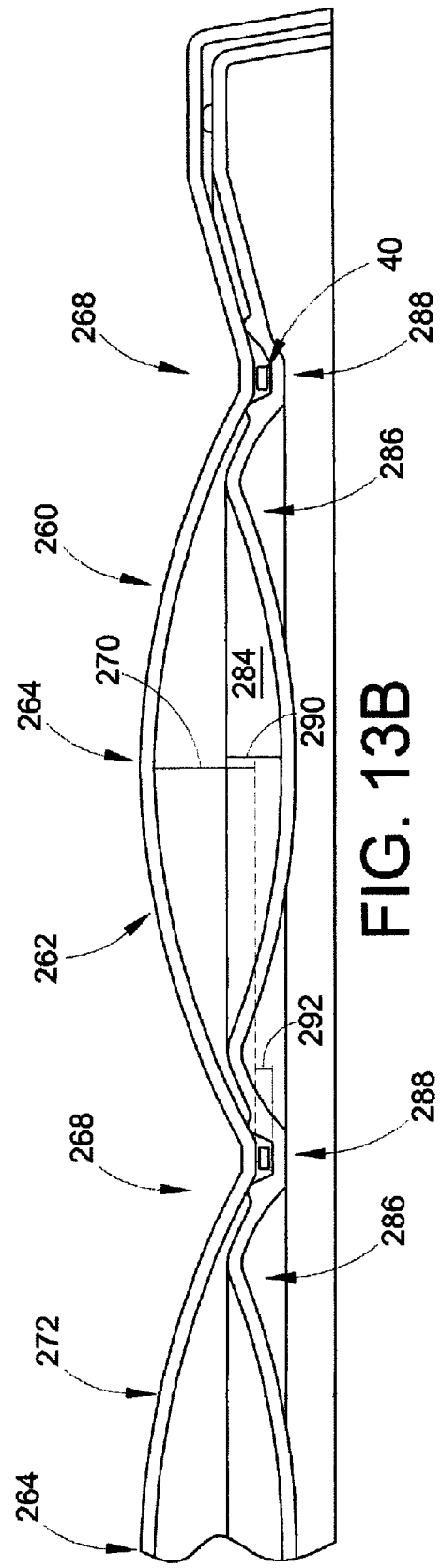

LUMINESCENT SOLAR CONCENTRATORS

CROSS-REFERENCE TO RELATED APPLICATIONS

This application claims priority to U.S. Provisional Patent Application Ser. No. 60/989,229, filed on Nov. 20, 2007. This application is related to U.S. patent application Ser. No. 12/194,008, titled LUMINESCENT SOLAR COLLECTOR, and filed Aug. 19, 2008; and to U.S. patent application Ser. No. 12/194,199, titled LUMINESCENT SOLAR COLLECTOR, and also filed Aug. 19, 2008. These three applications are hereby fully incorporated by reference herein.

BACKGROUND

The present disclosure relates generally to luminescent solar concentrators, including those having geometric and other improvements that provide increased and/or uniform output. It also relates to methods of manufacturing and utilizing such concentrators.

Luminescent solar concentrators, also known as luminescent solar collectors or LSCs, are beneficial for capturing solar energy (direct and diffuse sunlight) for use. The LSCs collect incident radiation over a large surface area and concentrate the energy to its edges where it is collected by photovoltaic (PV) cells.

An LSC usually comprises a collector, such as a flat sheet generally made from an optically transparent or semi-transparent material such as glass, a polymer, or like materials. Dispersed within the planar sheet is a fluorescent dye. The large face of the flat sheet can be considered the collection area. The dye in the flat sheet absorbs the sunlight and, via radiative and non-radiative transfer, emits light at a different, longer wavelength in all directions. A substantial fraction of this light is trapped in the flat sheet and can be transported, via total internal reflection (TIR), to at least one edge of the flat sheet.

The concentration of light from a large surface area to a smaller surface area (the edge) is also known as the "edge glow" effect. Due to this effect, the amount of light (i.e. energy) available at the edge is related to the collection area of the flat sheet. A light energy convertor, such as a silicon photovoltaic cell (or photocell), can be physically and/or optically attached to the at least one edge to convert the light energy transmitted thereto into electricity. The electricity can then be transported by wires, electrical leads, etc., from the photovoltaic cell to a desired location.

The cost of an LSC can be measured in terms of dollars per watt peak ($/Wp). One of the most expensive components of the LSC is the photovoltaic cell (PV cell). Hence, the cost of an LSC can be minimized by reducing the amount of silicon per watt of electric power output. Alternatively, the electric power output can also be increased. The electric power output is a function of the optical efficiency and concentration ratio of the collector. Optical efficiency is the percentage of the optical output available to illuminate the photovoltaic cell for any given amount of solar input. Concentration ratio is the ratio of the surface area of the output (i.e. the edge) to the surface area of the input (i.e. the collection area).

Generally, both high optical efficiency and high concentration ratio are desired. A high concentration ratio suggests a design that has a large collection area. However, a large collection area generally means the photons in the center of the collection area must travel a long distance to the photovoltaic cell. This reduces optical efficiency as those photons travel through the medium of the collector and are either absorbed or reflected away from a path that eventually arrives at the edge. On the other hand, a low concentration ratio requires greater usage of silicon.

Mechanical performance requirements must also be met. For example, for forming the collector, the polymer poly (methyl methacrylate) is good for light transmission (i.e. high optical efficiency), but lacks impact resistance and flame retardance, especially at high temperatures, and is thus difficult to use. Polycarbonate has good mechanical properties for producing the flat sheet, but has a lower optical efficiency, limiting its useful size and thus the concentration ratio.

In addition, the photovoltaic cell must be optically coupled to the collector. The photovoltaic cell, which is generally mostly silicon, is usually much more fragile than the collector, which is mostly polymeric. In particular, the materials have very different coefficients of thermal expansion (CTE). In other words, when exposed to heat, they expand at different rates. This mismatch must be accounted for to ensure that the photovoltaic cell does not break as the two components change dimensions. Other failure means, such as corrosion and delamination, also potentially exist.

There is a need for durable luminescent solar concentrators having geometric and other improvements that provide for increased performance.

BRIEF DESCRIPTION

Disclosed, in various embodiments, are luminescent solar concentrators having various configurations. They can be used in units, such as single tiles, and in modules, i.e. a collection of units, such as a plurality of tiles. Methods of making and using such LSCs are also disclosed.

In embodiments, a luminescent solar concentrator unit comprises a primary waveguide and a photovoltaic cell. The primary waveguide is defined by a convex curved surface connecting a perimeter and an apex. The perimeter forms a shape. The apex is located at a first apex height from a plane in which the perimeter lies and above the centroid of the perimeter shape. The photovoltaic cell has a primary absorption surface and is operatively connected to at least a portion of the perimeter of the primary waveguide. The plane of the primary absorption surface is also substantially parallel to the plane in which the perimeter of the primary waveguide lies.

The perimeter shape can be an equilateral triangle, square, regular hexagon, or rectangle. The perimeter shape can also be that of a polygon, the polygon having n edges, each edge having an edge length, wherein the edge length may be from about 50 mm to about 250 mm.

The unit may have a perimeter shape of a polygon having n edges and also have a total of n photovoltaic cells, each photovoltaic cell having a primary absorption surface and each photovoltaic cell being operatively connected to an edge of the perimeter so that the plane of the primary absorption surface of the photovoltaic cell is substantially parallel to the plane in which the perimeter of the primary waveguide lies.

The first apex height may be from about 15 mm to about 45 mm. Additionally, the primary waveguide may be formed from a composition comprising a polymer and a fluorescent colorant selected from the group consisting of a dye, a pigment, and a quantum dot.

The unit may have an angle of curvature at the intersection of the plane in which the perimeter lies and the curved surface of the primary waveguide, wherein the angle of curvature may be from about 15° to about 45°, including from about 25° to about 35°, or about 30°.

The primary waveguide may have a thickness from about 2 mm to about 5 mm. The primary waveguide may further comprise an outside edge equalizer. The outside edge equalizer is operatively connected to a portion of the perimeter of the primary waveguide. It is defined by an equalizer surface which rises from the plane in which the perimeter lies to a second height which is less than the first apex height. The equalizer surface then extends outwards from the perimeter at the second height for an outside edge length and then descends to or below the plane in which the perimeter lies. The equalizer surface has the same thickness as the primary waveguide.

The unit may further comprise a secondary waveguide which is defined by a convex curved surface connecting a perimeter and an apex. The perimeter forms a shape. The apex is located at a second apex height from a plane in which the perimeter lies and above the centroid of the perimeter shape. The photovoltaic cell has a secondary absorption surface which is operatively connected to at least a portion of the perimeter of the secondary waveguide. The plane of the secondary absorption surface is substantially parallel to the plane in which the perimeter of the secondary waveguide lies. The photovoltaic cell also defines a plane separating the apex of the primary waveguide and the apex of the secondary waveguide.

The unit may further comprise a structural back sheet located closer to the perimeter of the primary waveguide than the apex of the primary waveguide. The structural back sheet may also reflect light towards the primary waveguide. The structural back sheet may also be configured to maintain a spaced distance between the photovoltaic cell and the perimeter of the primary waveguide.

Two or more such units may be joined together to form a module. A portion of the perimeter of two units will overlap and a photovoltaic cell will be located under the overlapping portion. The units may be arranged in certain patterns or arrays.

In other embodiments, a luminescent solar concentrator module comprises a primary waveguide and a photovoltaic cell. The primary waveguide is defined by a curved surface connecting a first apex, a first perimeter surrounding the first apex, a second apex, a second perimeter surrounding the second apex, and a valley located between the first and second apexes. The first and second perimeters define a first plane. The first and second apexes are each located at a first apex height from the first plane. A portion of the primary waveguide curved surface connecting the first apex and the first perimeter is a convex surface and a portion of the primary waveguide curved surface connecting the second apex and the second perimeter is also a convex surface. The photovoltaic cell is oriented in a plane that is parallel to the upper plane and the first plane, and is operatively connected to the valley of the primary waveguide.

The first perimeter and the second perimeter may independently have the shape of a polygon.

The module may further comprise a back sheet. The back sheet is defined by a surface connecting a first nadir, a first rim surrounding the first nadir, a second nadir, a second rim surrounding the second nadir, and a pocket. As used herein, the term "nadir" refers to the lowest point on a surface or a portion of a surface. The first rim and second rim define an upper plane. The first nadir, second nadir, and pocket define a lower plane. The back sheet surface extends from the first rim to the pocket and then to the second rim. The photovoltaic cell is located in the pocket. The primary waveguide and back sheet are oriented such that the valley of the primary waveguide is below the upper plane, the first apex is substantially directly above the first nadir, the second apex is substantially directly above the second nadir, and the valley is substantially directly above the pocket. The back sheet may further comprise holders configured to maintain a spaced distance between a lower surface of the pocket and the valley.

A portion of the back sheet surface connecting the first nadir and the first rim may be a convex surface and a portion of the back sheet surface connecting the second nadir and the second rim may also be a convex surface.

The primary waveguide and back sheet may be joined at two joinder areas. One joinder area is located between the pocket and the first rim. The other joinder area is located between the pocket and the second rim.

The back sheet may also reflect light towards the primary waveguide.

The pocket may further contain a gel that encapsulates the photovoltaic cell.

The back sheet may further comprise an outside edge base. The outside edge base is operatively connected to a pocket and defined by a base surface which rises from the lower plane to an inner base plane, descends to an outside base plane, and then extends outwards for an outside base length. The primary waveguide may further comprise an outside edge equalizer. The outside edge equalizer is operatively connected to the first perimeter and defined by an equalizer surface. The equalizer surface rises from the first perimeter to a second height which is less than the first apex height, extends outwards at the second height for an outside edge length, then descends to contact the outside edge base along the outside base length.

In yet other embodiments, a luminescent solar concentrator sheet comprises a primary waveguide and a plurality of photovoltaic cells. The primary waveguide is defined by a curved surface having a plurality of peaks and a plurality of valleys. Each peak has substantially the same height and is surrounded by at least one valley. A portion of the curved surface joining the peak to the at least one valley is a convex surface. Each valley of the primary waveguide is located above an absorption surface of a photovoltaic cell.

The valleys of the primary waveguide and the pockets of the back sheet may correspond to a tessellation. Alternatively, the valleys of the primary waveguide and the pockets of the back sheet correspond to a pattern of polygon, the polygon being selected from the group consisting of an equilateral triangle, a square, and a regular hexagon.

The module may further comprise a back sheet. The back sheet is defined by a surface having a plurality of bowls, a plurality of rims, and a plurality of pockets. Each bowl has substantially the same depth and is a surface surrounded by a rim. Each rim contacts at least one pocket. At least one pocket contacts two rims. A photovoltaic cell is located in each pocket. The primary waveguide and back sheet are oriented such that each valley of the primary waveguide is located above a pocket of the back sheet. Each pocket is configured to maintain a spaced distance between a lower surface of the pocket and the valley above the pocket.

The back sheet may further comprise an outside edge base. The outside edge base is operatively connected to a perimeter of the back sheet surface and defined by a base surface. The base surface rises from a pocket to an inner base plane, descends to an outside base plane, then extends outwards for an outside base length. The primary waveguide may further comprise an outside edge equalizer which is operatively connected to a perimeter of the primary waveguide and defined by an equalizer surface. The equalizer surface rises from the perimeter to a second height which is less than the peak height, extends outwards at the second height for an outside edge length, then descends to contact the outside edge base along the outside base length.

The surface of each bowl may be a convex surface.

In other embodiments, a luminescent solar concentrator unit comprises a light concentrating substrate, a plurality of photovoltaic cells, and a back sheet. The light concentrating substrate has an index of refraction greater than that of the ambient atmosphere around the unit, a light receiving front surface, a back surface, and a light emitting perimeter. The perimeter defines a plane. The front surface and back surface maintain a fixed distance between each other. The substrate is curved so that the front surface has a greater surface area than the back surface. Each photovoltaic cell is located under the light emitting perimeter and oriented to present an absorption surface parallel to the plane defined by the perimeter. The back sheet is configured to maintain the spatial relationship between the light concentrating substrate and each photovoltaic cell.

The back sheet may comprise a plurality of pockets, each pocket configured to maintain a spaced distance between a photovoltaic cell inside the pocket and the light emitting perimeter of the light concentrating substrate. The back sheet may also comprise a reflective surface to reflect light towards the light concentrating substrate.

The light emitting perimeter of the light concentrating substrate may have the shape of a polygon.

In other embodiments, a luminescent solar concentrator unit comprises a light concentrating substrate, at least one photovoltaic cell, and a back sheet. The light concentrating substrate has an index of refraction greater than that of the ambient atmosphere around the unit and contains at least one fluorescent colorant for absorbing light and emitting light which travels through the substrate to a side edge. The substrate also has a light receiving surface and is curved so that the center of the light receiving surface is the point on the surface furthest from a plane defined by the side edge. The at least one photovoltaic cell is located to receive the light transmitted to the side edge of the substrate. The back sheet is configured to maintain the spatial relationship between the light concentrating substrate and the at least one photovoltaic cell.

The light concentrating substrate may have n side edges, the unit may have a total of n photovoltaic cells, and the back sheet can contain n pockets, a photovoltaic cell being located in each pocket.

These and other non-limiting characteristics of the luminescent solar concentrators of this disclosure are more particularly described below.

BRIEF DESCRIPTION OF THE DRAWINGS

The following is a brief description of the drawings, which are presented for the purposes of illustrating the exemplary embodiments disclosed herein and not for the purposes of limiting the same.

FIG. 9A is a cross-sectional view of the module of FIG. 8A.

FIG. 9B is a cross-sectional view of the module of FIG. 8B.

FIG. 10A is an enlarged view of FIG. 9A of the module at the valley.

FIG. 10B is a magnified view of FIG. 9B of the module at the valley.

FIG. 11A shows a single-layer embodiment having a further embodiment of an outside edge equalizer used in the present disclosure.

FIG. 11B shows a dual-layer embodiment having a further embodiment of an outside edge equalizer used in the present disclosure.

FIG. 12A is a perspective view of another single-layer luminescent solar concentrator module of the present disclosure.

FIG. 12B is a perspective view of another dual-layer luminescent solar concentrator module of the present disclosure.

FIG. 13A is a partial cross-sectional view of the module of FIG. 12A.

FIG. 13B is a partial cross-sectional view of the module of FIG. 12B.

DETAILED DESCRIPTION

Figure 1:
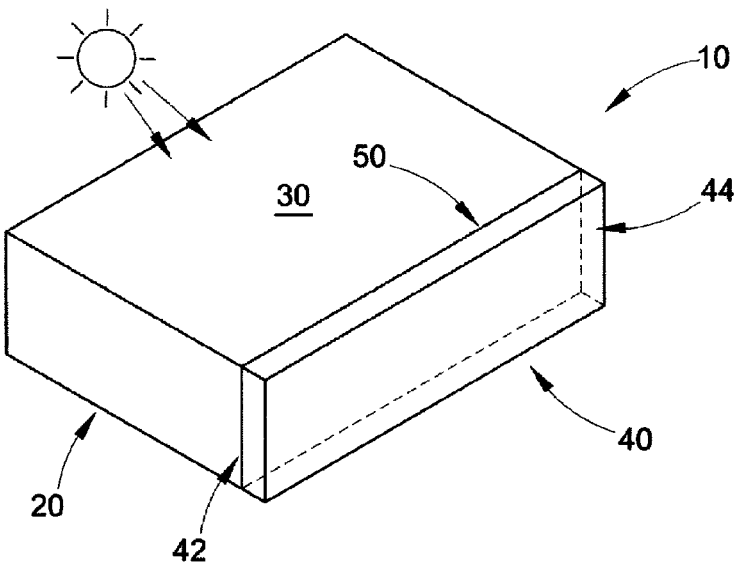
FIG. 1 is a conventional luminescent solar concentrator.

A more complete understanding of the components, processes and apparatuses disclosed herein can be obtained by reference to the accompanying drawings. These drawings are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

FIG. 1 illustrates generally a conventional LSC. The LSC 10 comprises a flat unit 20 having a collection area 30 exposed to incident sunlight. A photovoltaic cell 40 is mounted along an edge 50 of the unit. In particular, the photovoltaic cell 40 has a primary absorption surface 42 facing the edge 50. The other surfaces of the unit 20 may have a mirror coating.

An array can be made from a combination of units as well. In such an array, either a bifacial photovoltaic cell is needed between units (where the photovoltaic cell 40 has a secondary absorption surface 44) or two photovoltaic cells must be placed between units (not shown).

Figure 2:
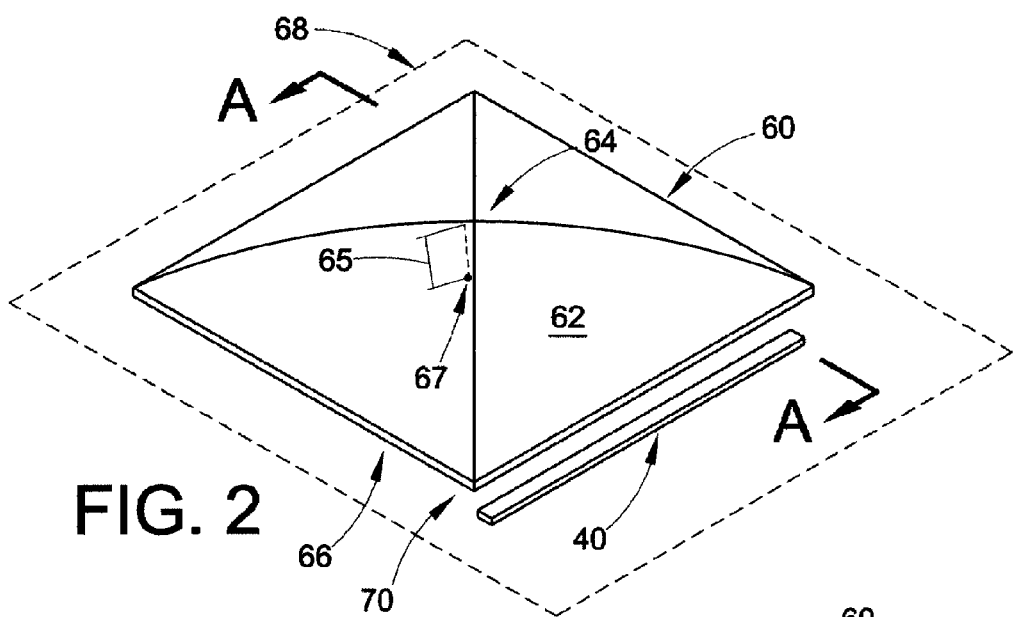
FIG. 2 is a luminescent solar concentrator unit of the present disclosure.
Figure 3:
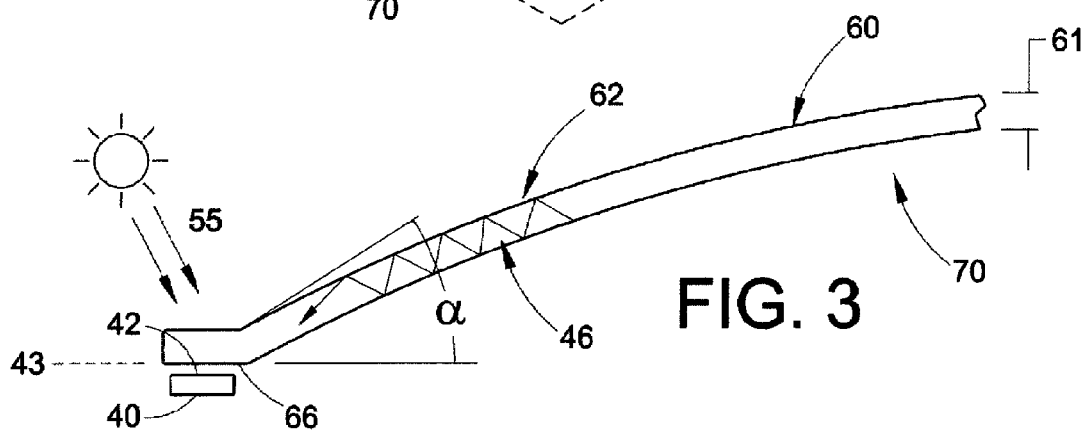
FIG. 3 is a cross-sectional view of the unit of FIG. 2.
Figure 4A:
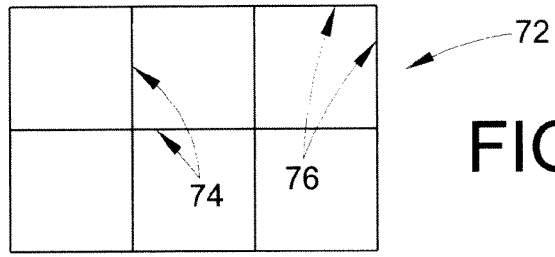
FIG. 4 shows various shapes (FIGS. 4A-4E) suitable for the perimeter of the primary waveguide used in the present disclosure.
Figure 4B:
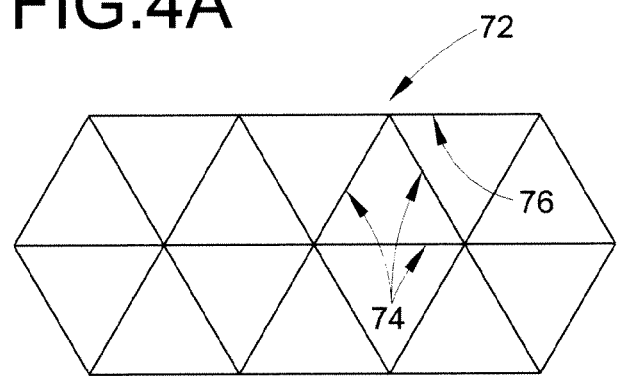
Figure 4C:
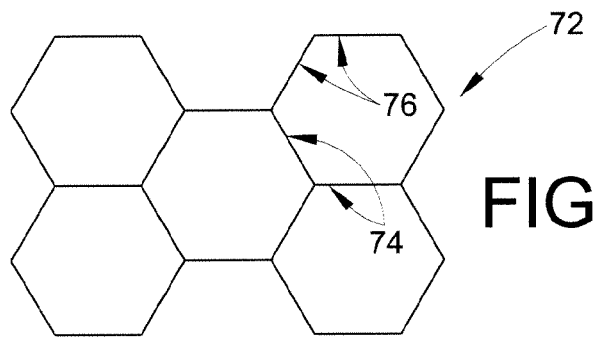
Figure 4D:
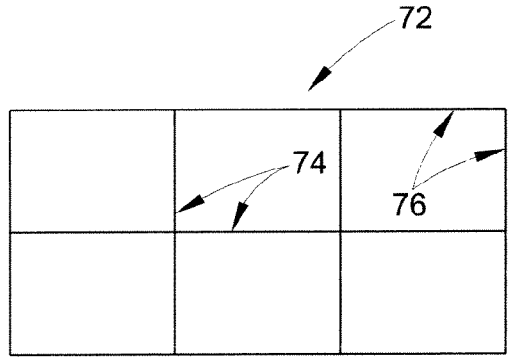
Figure 4E:
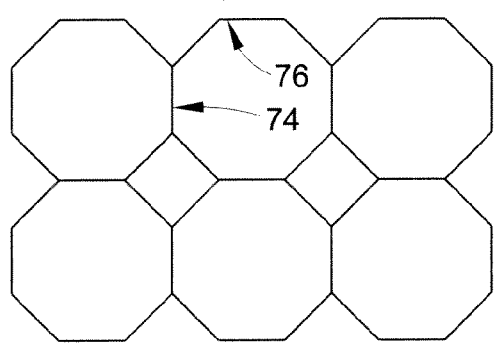

Referring to FIGS. 2 and 3, a luminescent solar concentrator unit 70 of the present disclosure comprises a primary waveguide 60 and a photovoltaic cell 40. The primary waveguide 60 is a convex curved surface 62. The curved surface 62 connects an apex 64 with a perimeter 66. The perimeter 66 forms a shape; here, the shape is that of a square. The perimeter also defines a plane 68. The apex 64 is located at a first apex height 65 (or distance) from the perimeter plane 68 and is located above the centroid 67 of the shape formed by the perimeter. For the square perimeter shown here, the centroid corresponds to the center of the square. As used here, the term "centroid" should be considered as referring to the average of the x-axis and y-axis points that form the perimeter shape, and specifically is not intended to refer to the center of mass of the perimeter shape. The convex curved surface 62 of the primary waveguide 60 corresponds to the collection area 30 of FIG. 1 for receiving sunlight or incident radiation and directing it towards the perimeter, which corresponds to the edge 50 of FIG. 1.

FIG. 3 is a cross-sectional view of the LSC unit 70 along line A-A of FIG. 2. The curved surface 62 is substantially convex. The photovoltaic cell has a primary absorption surface 42 which is operatively connected to at least a portion of the perimeter 66 of the primary waveguide. The plane 43 of the primary absorption surface is substantially parallel to the perimeter plane 68 (see FIG. 2). One benefit of this "horizontal" orientation is that the primary absorption surface 42 can receive the light 46 that has been concentrated by the primary waveguide 60 (spectrum shifted) and the direct sunlight 55 (spectrum unshifted) that the primary waveguide does not concentrate. In FIG. 1, by contrast, the primary absorption surface 42 is not oriented towards the sun; it has essentially a "vertical" orientation. In addition, horizontally mounted photovoltaic cells (i.e. 40 in FIG. 3) allow for easier assembly of the LSC unit and modules. It is also easier to protect the photovoltaic cell against mechanical and environmental influences.

The photovoltaic cell can be any type. Suitable bulk technology photovoltaic cells include amorphous silicon cells, multicrystalline silicon cells, polycrystalline silicon cells, and monocrystalline silicon cells. Suitable thin film technology photovoltaic cells include cadmium telluride cells, copper indium selenide cells, gallium arsenide or indium selenide cells, and copper indium gallium selenide cells. The photovoltaic cell can also be a high efficiency triple junction or bifacial photovoltaic cell. The photovoltaic cell is desirably a polycrystalline silicon cell.

The efficiency of a photovoltaic cell can be affected by the way the cell is produced. When photocells are produced by cutting using a 30 μm diamond saw compared to laser-guided water cutting, the photocell may increase its efficiency by 1%. For example, the photovoltaic cells of the present disclosure may be produced using a DISCO DAD 321 cutter (available from Disco Corporation) operating at 30,000 rpm. See also U.S. Pat. No. 4,097,310, the disclosure of which is hereby fully incorporated by reference herein. Generally, it is preferable for the photocell to have smooth edges and faces rather than rough edges and faces. In addition, photocells of greater width, such as about 6 mm, appear to provide better results compared to, for example, photocells of about 3 mm width.

As illustrated in FIG. 2, the perimeter 66 has the shape of a square. Certain perimeter shapes for the unit 70 optimize the usage of photovoltaic cells. In particular, perimeter shapes that allow for the formation of tessellations are especially suited for the LSCs of the present disclosure. A tessellation is a collection of shapes that fills a plane without overlaps or gaps. When photovoltaic cells are placed along the edges of these shapes, the concentration ratio is optimized. It also allows the photovoltaic cells to be serially connected to each other such that only one input and output is needed for the electrical power that is produced.

FIG. 4 shows some examples of various tessellations which are suitable for the LSC unit of FIG. 1, some more desirable than others. For example, when the perimeter of the primary waveguide 60 has a shape like that of a square (FIG. 4A), an equilateral triangle (FIG. 4B), a regular hexagon (FIG. 4C), or a rectangle (FIG. 4D), multiple LSC units can be coupled together so that photovoltaic cells placed at their edges 74 can receive concentrated light from two primary waveguides. Alternatively, FIG. 4E shows a tessellation combining octagons with squares. This would correspond to an array of LSCs formed from two different units. One consideration is that using different units together may result in photovoltaic cells on different edges receiving unequal illumination from direct sunlight as a result of different shadows being cast by the primary waveguides. Another consideration is that the performance of a number of photovoltaic cells in series is that of the most inefficient cell in the series. The use of regular shapes, i.e. a square, equilateral triangle, and regular hexagon, maximizes the equality of illumination for the photovoltaic cells. For example, the light level usually varies less than 5% over 75% of the edge of a hexagonal LSC unit.

In specific embodiments, the perimeter 66 of the primary waveguide has the shape of a polygon having edges. Those edges have an edge length and the edge length is from about 50 mm to about 250 mm. In more specific embodiments, the edge length is from about 130 mm to about 160 mm.

The primary waveguide apex 64 has a first apex height 65 above the plane 68 of the perimeter 66. The first apex height is generally from about 15 mm to about 45 mm.

The primary waveguide 60 generally has a thickness 61 of from about 2 mm to about 5 mm. An exemplary thickness is 3 mm.

In other embodiments, the luminescent solar concentrator unit 70 comprises a primary waveguide 60, where the perimeter 66 is that of a polygon having n edges, and the unit 70 has a total of n photovoltaic cells (i.e. one per edge), each photovoltaic cell being operatively connected to an edge of the perimeter 66. For example, the unit 70 of FIG. 2 may have a total of four photovoltaic cells.

The primary waveguide is generally made from a composition which comprises a polymer and a fluorescent colorant selected from the group consisting of a dye, a pigment, and a quantum dot. Such compositions are generally known in the art. For example, the polymer may be a polycarbonate or acrylic ester polymer, such as poly(methyl methacrylate). The polymer may contain about 0.02 weight percent of the fluorescent colorant, which has a high quantum efficiency usually greater than 80%. By selecting a proper combination of fluorescent colorants, it is possible to capture nearly the entire visible spectrum of the sun. The fluorescent colorant(s) should also be selected so that the wavelengths emitted at the edge of the primary waveguide match, as much as possible, the "sweet spot", or range of wavelengths (light energy) which the photovoltaic cell converts most efficiently into electric energy. For example, the sweet spot of a multicrystalline silicon photovoltaic cell or a monocrystalline silicon photovoltaic cell is from about 700 nanometers to about 1100 nanometers. The composition may also include other additives, such as UV stabilizers; diffusers; fillers or reinforcing agents; heat stabilizers; antioxidants; light stabilizers; plasticizers; antistatic agents; blowing agents; lubricants; and/or mold release agents.

Some specific fluorescent dyes which may be used in the primary waveguide include the following, which have the listed characteristics:

| Dye | Absorption $\lambda_{max}$ (nm) | Emission $\lambda$ (nm) | % quantum yield |
|---|---|---|---|
| Lumogen ® F Yellow 083 | 476 | 490 | >85 |
| Lumogen ® F Yellow 170 | 505 | 528 | >90 |
| Lumogen ® F Orange 240 | 524 | 539 | >90 |
| Lumogen ® F Pink 285 | 547 | 580 | >78 |
| Lumogen ® F Red 305 | 578 | 613 | >90 |
| Lumogen ® F Violet 570 | 378 | 413 | >85 |
| Lumogen ® F Blue 650 | 377 | 411 | >80 |
| Lumogen ® F Green 850 | 475 | 489 | >90 |

The LSC unit 70 can be combined with other units to form an array 72 (see FIG. 4 for five such examples). In such an array 72, there will be photovoltaic cells on the "inside" 74 of the array and photovoltaic cells on the "edge" 76 of the array. Those photovoltaic cells on the "edge" of the array do not receive concentrated light from two primary waveguides like those on the "inside" of the array.

Figure 5:
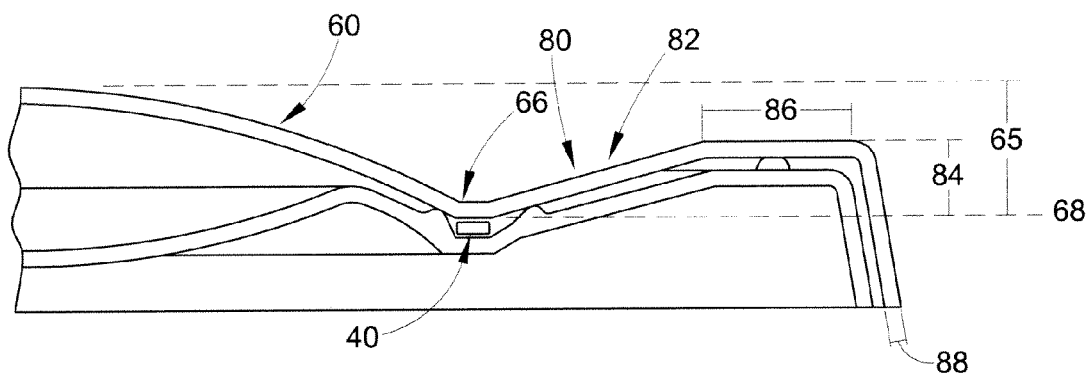
FIG. 5 shows a first embodiment of an outside edge equalizer used in the present disclosure.

Referring to FIG. 5, the primary waveguide 60 may further comprise an outside edge equalizer 80 which is generally intended to ensure that photovoltaic cells on the "edge" receive greater illumination. The outside edge equalizer 80 is operatively connected to a portion of the perimeter 66 of the primary waveguide. An equalizer surface 82 rises from the perimeter plane 68 to a second height 84 which is less than the first apex height 65. The surface 82 then extends outwards from the perimeter at the second height for an outside edge length 86. The surface 82 then descends downwards to or below the perimeter plane 68. The equalizer surface 82 generally, but not necessarily, has the same thickness 88 as the primary waveguide thickness 61.

As noted before, the photovoltaic cell 40 may be a bifacial photovoltaic cell (i.e. having a primary absorption surface 42 and a secondary absorption surface 44). To take advantage of this, the unit 70 may further comprise a secondary waveguide 90.

Figure 6:
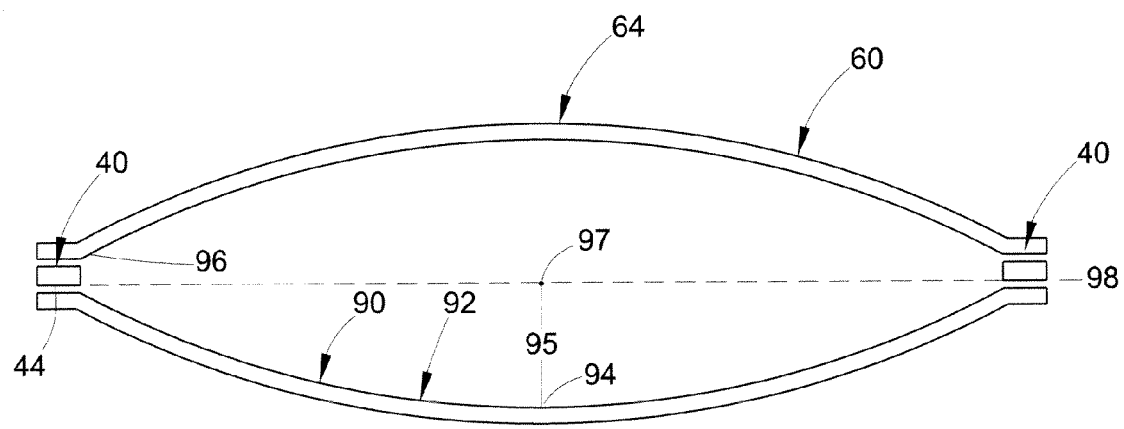
FIG. 6 shows an embodiment including a secondary waveguide.

Referring to FIG. 6, the secondary waveguide 90 is generally constructed using the same materials and in the same manner as the primary waveguide 60. The secondary waveguide 90 is a curved surface 92 that connects an apex 94 with a perimeter 96. The perimeter 96 forms a shape and also defines a plane 98. The curved surface 92 is substantially convex with respect to plane 98. The apex 94 is located at a second apex height 95 (or distance) from the perimeter plane 98 and is located above the centroid 97 of the shape formed by the perimeter. A portion of the perimeter 96 is operatively connected to the secondary absorption surface 44 of the photovoltaic cell 40. The primary waveguide 60 and secondary waveguide 90 are oriented with respect to each other so as to have a biconcave form. Put another way, any one of the photovoltaic cell 40, primary waveguide perimeter plane 68, or secondary waveguide perimeter plane 98 separate the primary waveguide apex 64 and secondary waveguide apex 94.

The secondary waveguide 90 can be used to absorb any sunlight that passes through the primary waveguide and direct that sunlight to the photovoltaic cell 40, basically increasing the concentration ratio of the overall LSC. Alternatively, the primary waveguide 60 and secondary waveguide 90 can be tuned, through the use of different fluorescent colorants and/or concentrations, to absorb different parts of the light spectrum.

Figure 7A:
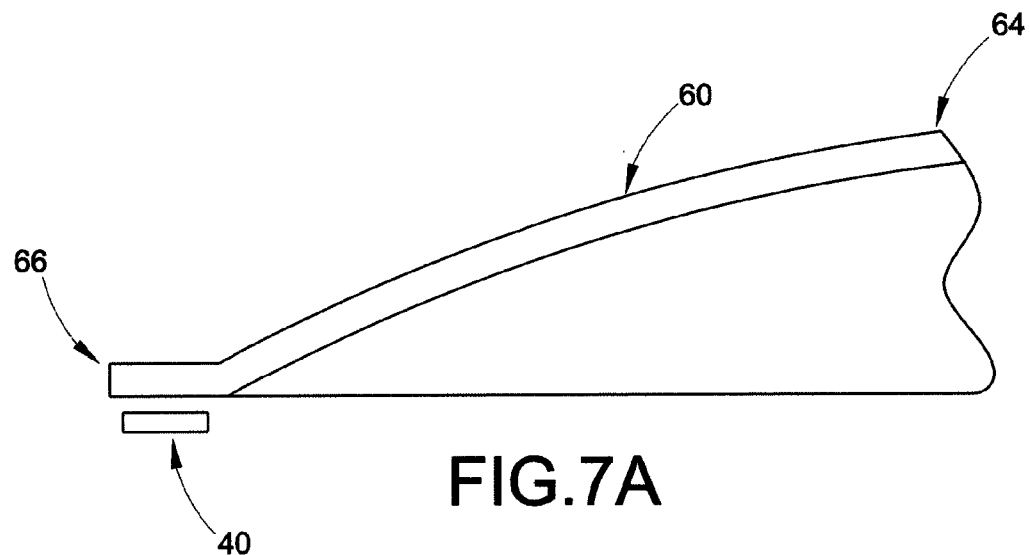
FIG. 7A shows an exemplary top sheet used in the present disclosure.
Figure 7B:
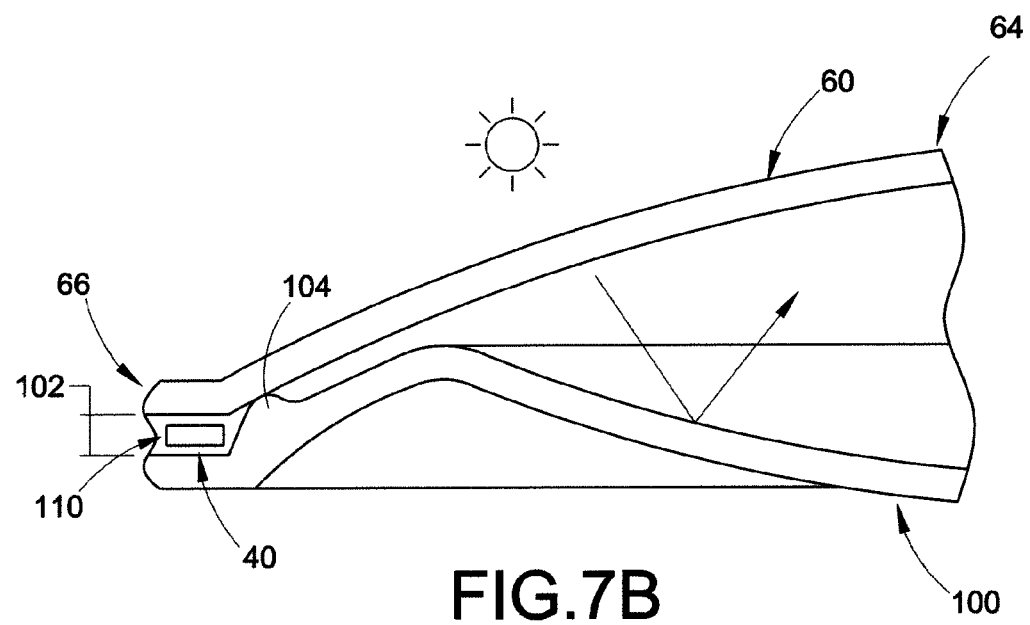
FIG. 7B shows a back sheet which may be included in the embodiment shown in FIG. 7A.

The unit 70 may further comprise a back sheet 100. The back sheet can provide structural support to the unit, provide a mounting location for the photovoltaic cell, provide protection to the overall unit, and increase ease of installation/maintenance of the unit 70. FIG. 7A shows a single-layer embodiment without a back sheet. Referring to FIG. 7B, the back sheet 100 is generally installed so that the primary waveguide 60 is between the back sheet 100 and the sun or other source of incident radiation. Put another way, the back sheet 100 is closer to the perimeter 66 than the apex 64 of the primary waveguide 60. The back sheet may generally be made from any type of material, such as a polymer sheet, wire mesh, etc. In some embodiments, the back sheet is made from a material such that light passing through the primary waveguide 60 is reflected back towards the primary waveguide 60 in a diffuse manner, (i.e. so that the light returning to the primary waveguide does not have one general direction). The back sheet 100 may also have a pocket 110 that is configured to maintain a spaced distance 102 between a photovoltaic cell 40 located in the pocket 110 and the perimeter 66 of the primary waveguide 60. For example, as depicted here, at least one holder 104 contacts the primary waveguide 60, preventing it from riding lower into the pocket 110 and possibly damaging the photovoltaic cell 40.

The back sheet is generally composed of a supportive material, such as a polymeric material. If desired, a reflective coating may also be applied to the back sheet. For example, the back sheet can be made from a polycarbonate (PC), polystyrene (PS), polyvinyl chloride (PVC), polypropylene (PP), poly(phenylene oxide) (PPE), acrylonitrile-butadiene-styrene (ABS), acrylonitrile-styrene-acrylate (ASA), and poly(methyl methacrylate) (PMMA).

Figure 8A:
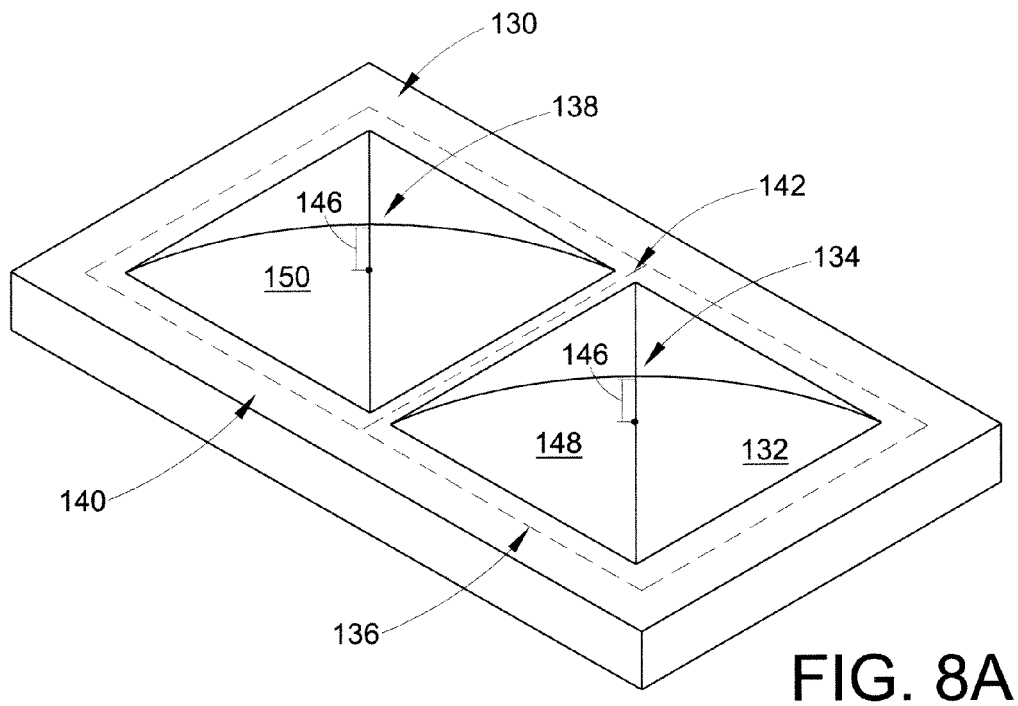
FIG. 8A is a perspective view of a single-layer embodiment of a luminescent solar concentrator module of the present disclosure.

In further embodiments, a luminescent solar concentrator module 120 comprises a primary waveguide 130 and a photovoltaic cell 40. FIG. 8A is a perspective view of this single-layer embodiment of module 120, FIG. 9A is a cross-sectional view of FIG. 8A, and FIG. 10A is a magnified view of FIG. 9A.

The primary waveguide 130 is defined by a curved surface 132 connecting a first apex 134, a first perimeter 136 surrounding the first apex, a second apex 138, a second perimeter 140 surrounding the second apex, and a valley 142 located between the first and second apexes. The valley 142 can also be considered to be a location where the first perimeter 136 and second perimeter 140 overlap. The first and second perimeters define a first plane 144 (see FIG. 10B). The first apex 134 and second apex 138 are each located at a first apex height 146 from the first plane 144. A portion 148 of the primary waveguide curved surface connecting the first apex 134 and the first perimeter 136 is a convex surface and a portion 150 of the primary waveguide curved surface connecting the second apex 138 and the second perimeter 140 is a convex surface. The photovoltaic cell 40 is oriented in a plane that is parallel to the first plane, and is operatively connected to the valley 142 of the primary waveguide.

Figure 8B:
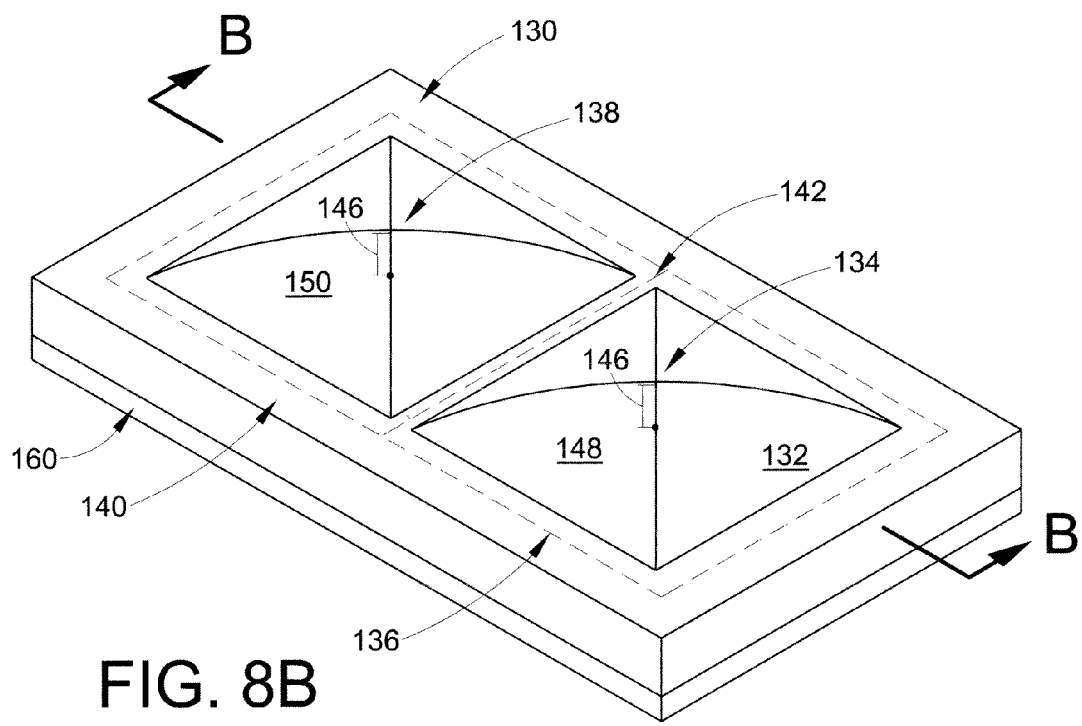
FIG. 8B is a perspective view of a dual-layer embodiment of a luminescent solar concentrator module of the present disclosure.

The luminescent solar concentrator module 120 may further comprise a back sheet 160. FIG. 8B is a perspective view of a dual-layer embodiment of such a module 120, FIG. 9B is a cross-sectional view of a module 120 taken along line B-B of FIG. 8B, and FIG. 10B is a magnified view of FIG. 9B.

The back sheet 160 is defined by a surface 162 connecting a first nadir 164, a first rim 166 surrounding the first nadir, a second nadir 168, a second rim 170 surrounding the second nadir, and a pocket 172. The first rim 166 and second rim 170 define an upper plane 174. The first nadir 164, second nadir 168, and pocket 172 define a lower plane 176. The back sheet surface 162 extends from the first rim 166 to the pocket 172 and then to the second rim 170. A photovoltaic cell 40 is located in the pocket 172 in a plane 182 that is parallel to the upper plane 174 and the first plane 144 and is operatively connected to the valley 142 of the primary waveguide 130. The primary waveguide 130 and back sheet 160 are oriented such that the valley 142 of the primary waveguide is below the upper plane 174, the first apex 134 is substantially directly above the first nadir 164, the second apex 138 is substantially directly above the second nadir 168, and the valley 142 is substantially directly above the pocket 172. Put another way, the first apex 134 and first nadir 164 define a line that is substantially perpendicular to the first plane 144 or upper plane 174, the second apex 138 and the second nadir 168 define a line that is substantially perpendicular to the first plane 144 or upper plane 174, and the valley 142 and the pocket 172 define a plane that is substantially perpendicular to the first plane 144 or upper plane 174. The back sheet 160 further comprises holders 184 configured to maintain a spaced distance 186 between a lower surface 188 of the pocket 172 and the valley 142. In particular embodiments, the spaced distance is about 2 mm.

As shown here, a portion 178 of the back sheet surface 162 connecting the first nadir 164 and the first rim 166 is a convex surface and a portion 180 of the back sheet surface 162 connecting the second nadir 168 and the second rim 170 is a convex surface. The back sheet 160 also is shown with multiple pockets 172. This parabolic shape gives the back sheet more rigidity than if the back sheet were flat. In embodiments, the primary waveguide 130 and back sheet 160 are joined together by two joinder areas 190. One joinder area is located between the pocket 172 and the first rim 166; the other is located between the pocket 172 and the second rim 170. These joinder areas are generally created by the holders 184. In addition, the location of the joinder areas (near the photovoltaic cells) minimizes stress and movement of the photovoltaic cells. The primary waveguide and back sheet can be joined together by placing glue in the joinder area or by other means, such as laser welding.

Several aspects of any adhesive used to join the primary waveguide and back sheet together may affect the efficiency of the luminescent solar concentrator. Generally, different types of adhesive may be used, such as silicone resins, acrylic resins, optical tape such as that from 3M®, etc. The color of the adhesive may make a difference. In particular, the adhesive should not be black as this appears to absorb light, preventing the light energy from reaching the photovoltaic cell. Desirably, the adhesive is transparent. A thinner adhesive layer is preferred to a thick adhesive layer. For example, adhesive layer thicknesses of from about 0.5 to about 2 mm are preferable. In some embodiments, Loctite® 3321, a transparent acrylic UV-curable adhesive, is used. Depending on the adhesive, the efficiency of the solar concentrator can be increased up to 3.5%.

The pocket 172 holds the photovoltaic cell 40. In addition, an encapsulant 192 may be included in the pocket 172. The encapsulant surrounds the photovoltaic cell and acts as both a barrier (to moisture, oxygen, etc.) and a cushion, decoupling mechanical movement between the back sheet 160 and the photovoltaic cell 40. The encapsulant also acts to optically couple the photovoltaic cell 40 with the primary waveguide 130. An exemplary encapsulant is Momentive RTV 6166 optical quality gel (available from Momentive Performance Materials).

In some embodiments, the first perimeter 136 and second perimeter 140 are polygons. They are usually the same shape, but as seen in FIG. 4, do not need to be. They may be, in particular embodiments, selected from the group consisting of an equilateral triangle, a square, and a regular hexagon.

As with the unit 70, the module 120 may comprise multiple photovoltaic cells. Again, some will be considered as being on the "edge" of the module and some on the "inside" of the module. Thus, the primary waveguide 130 may further comprise an outside edge equalizer 80 which is generally intended to ensure that photovoltaic cells on the "edge" receive greater illumination. One version of the equalizer 80 is described in FIG. 5. Another version is shown in FIGS. 11A and 11B.

FIG. 11A is a single-layer embodiment having an outside edge equalizer; FIG. 11B is a dual-layer embodiment which includes a back sheet. The back sheet 160 further comprises an outside edge base 200. The outside edge base 200 is operatively connected to a pocket 172 and defined by a base surface 202 which rises from the lower plane 176 to an inner base plane 206. The base surface 202 then descends to an outside base plane 208, then extends outwards for an outside base length 210. Again, the outside edge equalizer 80 is operatively connected to a portion of the perimeter 136 or 140 of the primary waveguide 130. An equalizer surface 82 rises from the perimeter plane to a second height 84 which is less than the first apex height 146. The surface 82 then extends outwards from the perimeter at the second height for an outside edge length 86. The surface 82 then descends downwards to the outside base plane 208.

In further embodiments, a luminescent solar concentrator sheet or module 250 as shown in FIG. 12A comprises a primary waveguide 260 and a plurality of photovoltaic cells 40. FIG. 12A is a view of this single-layer embodiment. FIG. 13A is a cross-sectional view of FIG. 12A.

The primary waveguide 260 is defined by a curved surface 262 having a plurality of peaks 264 and a plurality of valleys 268. Each peak 264 has substantially the same height 270. Each peak is surrounded by at least one valley 268 and a portion 272 of the curved surface 262 joining the peak to the at least one valley is a convex surface. Each valley 268 of the primary waveguide is located above an absorption surface of a photovoltaic cell 40.

The luminescent solar concentrator sheet or module 250 may further comprise a back sheet 280. FIG. 12B is a view of this dual-layer embodiment. FIG. 13B is a cross-sectional view of the module FIG. 12B.

The back sheet 280 is defined by a surface having a plurality of bowls 284, a plurality of rims 286, and a plurality of pockets 288. Each bowl 284 has substantially the same depth 290. Each bowl 284 is a surface surrounded by a rim 286. Each rim 286 contacts at least one pocket 288 and at least one pocket 288 contacts two rims 286. A photovoltaic cell 40 is located in each pocket 288. The primary waveguide 260 and back sheet 280 are oriented such that each valley 268 of the primary waveguide is located above a pocket 288 of the back sheet and each pocket 288 is configured to maintain a spaced distance 292 between a lower surface 294 of the pocket and the valley above the pocket. Each bowl 284 may be considered as having a parabolic shape.

The primary waveguide 260 of FIG. 12A has 18 peaks and 45 valleys. The back sheet of FIG. 12B has 18 bowls, 18 rims, and 45 pockets. Each peak and the four valleys surrounding it can be analogized to the unit of FIG. 2. The number of peaks, valleys, bowls, rims, and pockets will change depending on the shape of the unit.

In some embodiments, the valleys of the primary waveguide and the pockets of the back sheet correspond to a tessellation. In other embodiments, the valleys of the primary waveguide and the pockets of the back sheet correspond to a pattern of polygons, wherein the polygon is selected from the group consisting of an equilateral triangle, a square, and a regular hexagon.

Again, there will be some photovoltaic cells on the "inside" that will receive illumination from two peaks and some on the "edge" of the module. Thus, the module may further comprise the outside edge equalizer design of FIG. 5 or 11. In particular, referring to FIG. 11B, the back sheet 280 can further comprise an outside edge base 200, the outside edge base being operatively connected to a perimeter 296 of the back sheet surface 282 and defined by a base surface 202 which rises from a pocket 288 to an inner base plane 206, descends to an outside base plane 208, then extends outwards for an outside base length 210. The primary waveguide 260 can further comprise an outside edge equalizer 80, the outside edge equalizer being operatively connected to a valley 268 of the primary waveguide and defined by an equalizer surface 82 which rises from the valley to a second height 84 which is less than the peak height 270, extends outwards at the second height for an outside edge length 86, then descends to contact the outside edge base 200 along the outside base length 210.

Figure 14A:
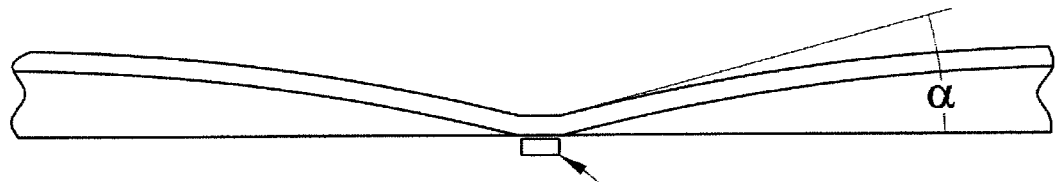
FIG. 14A is a cross-sectional view of another single-layer embodiment of a module having a different angle of curvature.
Figure 14B:
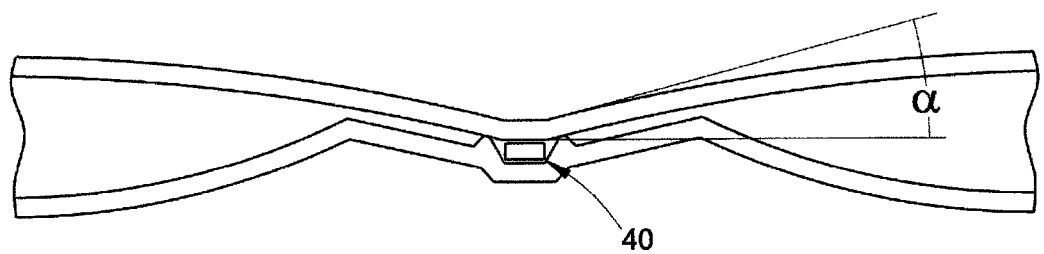
FIG. 14B is a cross-sectional view of another dual-layer embodiment of a module having a different angle of curvature.
Figure 15A:
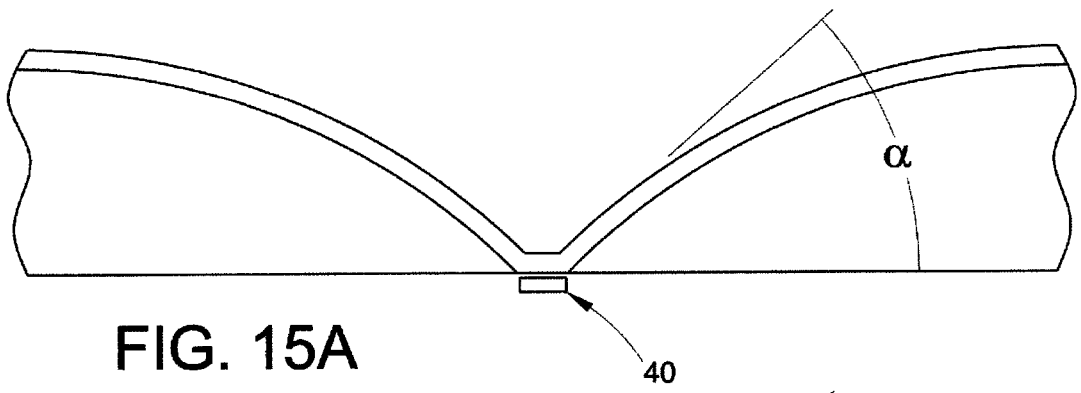
FIG. 15A is a cross-sectional view of another single-layer embodiment of a module having another different angle of curvature.
Figure 15B:
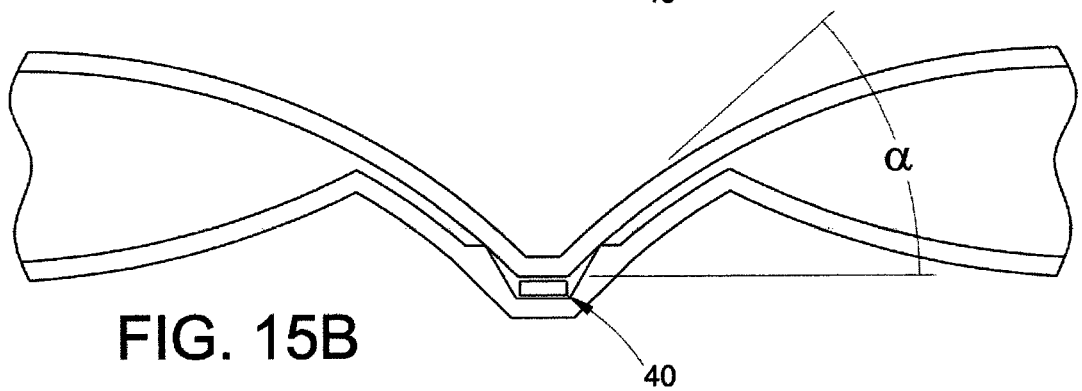
FIG. 15B is a cross-sectional view of another dual-layer embodiment of a module having another different angle of curvature.

Referring back to FIG. 3, the LSC unit has an angle of curvature α at the intersection of the perimeter plane 68 and the curved surface 62 of the primary waveguide. The angle of curvature α is from 15° to 45° or, in other embodiments, from 25° to 35°. The angle is chosen such that the maximum amount of direct sunlight (where the spectrum is not shifted) is captured by the photovoltaic cell. For example, the angle can affect how quickly shadow falls on the photovoltaic cell. FIG. 14A shows a cross-sectional view of a single-layer embodiment where the angle of curvature is 15°. FIG. 14B shows a cross-sectional view of a dual-layer embodiment where the angle of curvature is 15°. FIG. 15A shows a cross-sectional view of single-layer embodiment where the angle of curvature is 45°. FIG. 15B shows a cross-sectional view of single-layer embodiment where the angle of curvature is 45°. In some embodiments, the angle of curvature is about 30°. The LSC module of FIGS. 8-10 will also have angles of curvature where the portion of the primary waveguide curved surface descending from an apex intersects the perimeter surrounding the apex. The LSC module of FIG. 12B will also have angles of curvature where the portion of the primary waveguide curved surface descending from a peak intersects a valley surrounding the peak.

The primary waveguide and back sheet can be made using a variety of means such as injection molding, extrusion, rotational molding, blow molding and thermoforming. In specific embodiments, thermoforming or injection molding is used. The shapes of the primary waveguide and back sheet also increase the overall stiffness of the unit/module compared to a flat sheet. The shape of the primary waveguide is also aesthetically pleasing.

Figure 16:
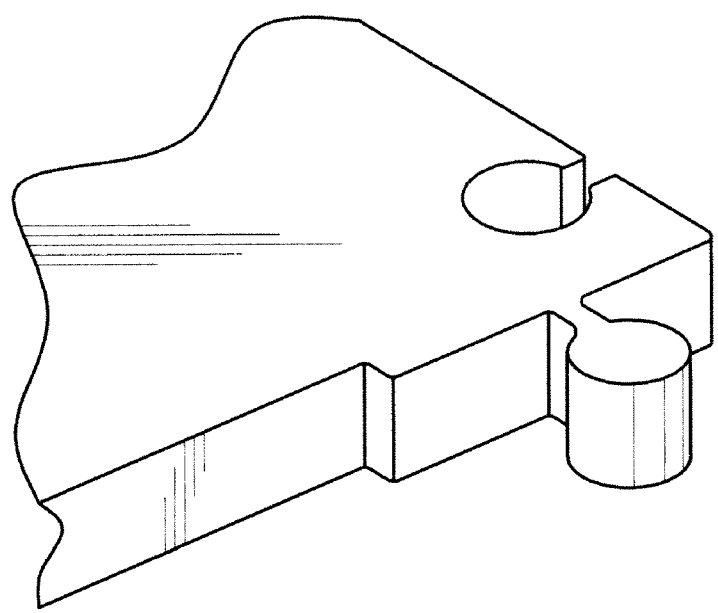
FIG. 16 shows one embodiment of a snap fitting for the units/modules of the present disclosure.
Figure 17:
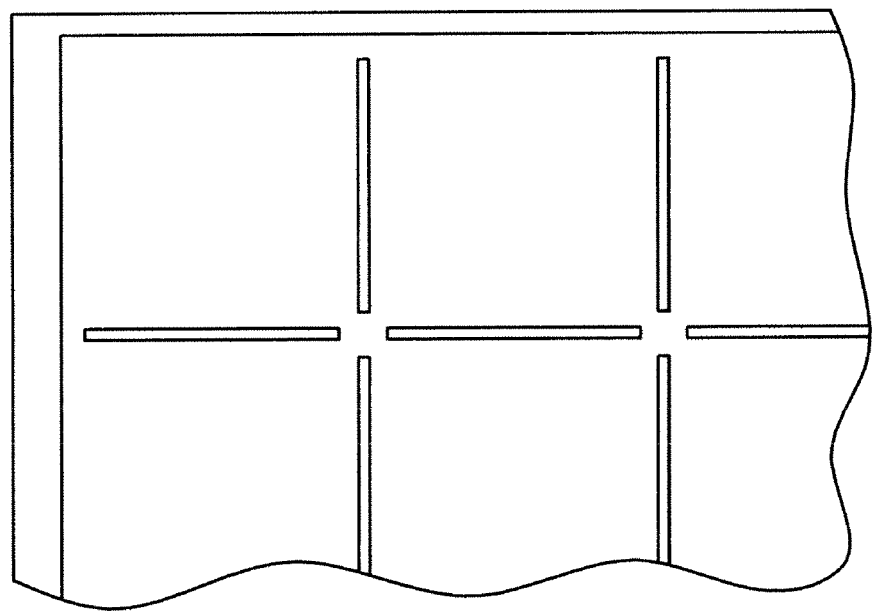
FIG. 17 illustrates how units can be snapped together to form a larger module.

The units and modules described herein can be joined together to form larger LSC arrays. FIG. 16 shows one embodiment of a snap fitting for the units/modules. FIG. 17 shows an example of how units can be snapped together to form a larger module.

The luminescent solar concentrator units and modules are suitable for solar power generation applications in various manners such as building facades, on rooftops (such as a skylight or roofing tile), in highway/railroad sound barriers, greenhouses, dual purpose window/glazing, and commercial buildings.

The following examples are provided to illustrate the luminescent solar concentrators of the present disclosure. The examples are merely illustrative and are not intended to limit devices made in accordance with the disclosure to the materials, conditions, or process parameters set forth therein. All parts are percentages by volume unless otherwise indicated.

EXAMPLES

Example 1

A luminescent solar concentrator module was made consisting of a primary waveguide, a back sheet, four photovoltaic cells, wiring, a junction box, gel, and adhesive. The design was optimized to maximize the total amount of light reaching a photovoltaic cell. Both the primary waveguide and the back sheet were extruded, then thermoformed into the desired shape, using methods known in the art.

The primary waveguide was a clear transparent polycarbonate (LEXAN® polycarbonate, available from SABIC Innovative Plastics) with a luminescent dye (a red Lumogen® dye) and a UV stabilization coating. The back sheet was a matte white polycarbonate. Photovoltaic cells were cut to be the same size as the emitting edges of the primary waveguide.

The photovoltaic cells were arranged on the back sheet, with distance holders underneath placed so that there was a gap of about 1.5 mm between the back sheet and the cells. Wires were then glued onto the cells while ensuring the wires did not block the top absorption surface of the photovoltaic cell. The photovoltaic cells were coupled serially and connected to a junction box on the back of the back sheet. An adhesive, Momentive IS5138E (available from Momentive Performance Materials), was then applied to joinder areas close to the photovoltaic cells to minimize stress on the cells. Next, the primary waveguide was put on top of the assembly, making sure no glue flowed from the joinder area into the pockets of the back sheet (containing the photovoltaic cells). Two holes were then made in the back sheet, one for filling and one for venting. A very soft silicone gel, Momentive RTV6166 gel (available from Momentive Performance Materials), was then slowly injected into the pockets so no bubbles or air traps were formed and to act as an encapsulant. The LSC module was subsequently cured.

The LSC module had a rectangular footprint of 64 cm×114 cm, or 0.763 m². Each photovoltaic cell was 6 mm deep, 156 mm long, and had an absorption surface of 0.042 m². The LSC module used a total of 45 photovoltaic cells.

The LSC module was tested on an indoor sun simulator that provided illumination of 1000 W/m² at 25° C. and direct irradiation. Three controls were used: (1) a GE Solar 50 Wp module using crystalline silicon; (2) a Schott 5 W stabilized module using amorphous silicon; and (3) a Kaneka 60 W module using amorphous silicon. These three modules are all flat and do not use any kind of light concentration means (such as the primary waveguide of the instant LSC module). The GE Solar 50 Wp module used the same type of photovoltaic cell, whereas the Schott and Kaneka modules used a different type. Upon exposure, the results shown in Table 1 were obtained. Pmpp refers to the power output at maximum power point, a commonly used metric for solar modules where the voltage multiplied by the output current is maximum. Impp is the current at the maximum power point. Umpp is the voltage at the maximum power point. FF is the fill factor, the ratio of a photovoltaic cell's actual power to the Pmpp.

TABLE 1

| Module | Pmpp (W) | Impp (A) | Umpp (V) | FF (%) | Area (m$^2$) | Efficiency (%) |
|---|---|---|---|---|---|---|
| LSC | 13.7 | 0.68 | 20.1 | — | 0.73 | 1.88 |
| GE | 50.1 | 2.71 | 18.5 | 65 | 0.57 | 8.8 |
| Schott | 6.2 | 0.31 | 19.8 | 63.4 | 0.1 | 6.2 |
| Kaneka | 86.6 | 1.15 | 75.5 | 63 | 0.95 | 9.1 |

In addition, the power resulting from the direct irradiation of the photovoltaic cell was calculated at about 4.2 W, or about 31% of the 13.7 W produced by the LSC module.

Example 2

It was expected that losses in optical efficiency would result from surface defects and contamination since total internal reflecting conditions are not optimal. It was thus expected that the type of adhesive used to join the primary waveguide and back sheet together would cause large losses in edge emission.

A computer simulation was performed wherein the adhesive was a 20 mm broad strip of black glue. Without the black glue, the edge emission was 3000 W/m$^2$ and 2.99 W. With the black glue, the emission was 459 W/m$^2$ and 0.45 W. Thus, the use of black glue reduced edge emission by 85%.

Next, a square unit was used to measure the loss due to acrylic paste. First, the edge emission was measured for each edge of the unit without any acrylic paste joining the primary waveguide and back sheet. Next, a 7 mm broad strip of acrylic paste was applied to all four sides of the primary waveguide and emission of each edge was measured. Additional acrylic paste was then added to form a 14 mm broad strip and the emission of each edge was measured again. The measurements were then normalized. The 7 mm strip had an average loss of 32% (over all four edges) and the 14 mm strip had an average loss of 51%.

Example 3

Three different adhesives were tested at three different thicknesses to determine their effect on the efficiency of a luminescent solar concentrator. The three adhesives were Loctite® 3321 resin (an acrylic-based UV curable resin), RTV 6166 resin (a 2-component silicone resin from Momentive Performance Materials), and 3M® VHB-4910 optical tape. The three thicknesses were 0.5 mm, 1 mm, and 2 mm. The efficiencies were tested before the adhesive was added, and after the adhesive was added. Results are shown in Table 2.

TABLE 2

| Adhesive | Thickness (mm) | Efficiency Before Adhesive (%) | Efficiency After Adhesive (%) | Efficiency Gain (%) |
|---|---|---|---|---|
| optical tape | 0.5 | 11.17 | 11.22 | 0.05 |
| optical tape | 1 | 9.73 | 10.69 | 0.96 |
| optical tape | 2 | 10.73 | 11.78 | 1.05 |
| Silicone resin | 0.5 | 9.62 | 10.74 | 1.12 |
| Silicone resin | 1 | 9.18 | 10.63 | 1.45 |
| Silicone resin | 2 | 9.70 | 11.85 | 2.15 |
| acrylic resin | 0.5 | 8.94 | 12.23 | 3.29 |
| acrylic resin | 1 | 9.33 | 12.12 | 2.79 |
| acrylic resin | 2 | 8.83 | 11.27 | 2.44 |

The cell efficiency increased after application of adhesive. The Loctite® 3321 resin provided the best increase in efficiency. It also has high mechanical stability. The silicone was suitable, but its mechanical stability was not high. The performance differences were attributed to differences in wetting behavior (how well the materials coat the surfaces) and refractive index of the adhesive relative to the polycarbonate The luminescent solar concentrators of the present disclosure have been described with reference to exemplary embodiments. Obviously, modifications and alterations will occur to others upon reading and understanding the preceding detailed description. It is intended that the exemplary embodiments be construed as including all such modifications and alterations insofar as they come within the scope of the appended claims or the equivalents thereof.

The invention claimed is:

1. A luminescent solar concentrator unit comprising a primary waveguide and a photovoltaic cell;
    the primary waveguide defined by a convex curved surface connecting a perimeter and an apex, the perimeter forming a shape in a plane, and the apex located at a first apex height from the plane in which the perimeter lies and above the centroid of the perimeter shape; wherein an angle of curvature between the intersection of the plane in which the perimeter lies and the surface of the primary waveguide is 15° to 45°;
    wherein the photovoltaic cell has a primary absorption surface; and
    wherein the primary absorption surface is operatively connected to at least a portion of the perimeter of the primary waveguide and the plane of the primary absorption surface is substantially parallel to the plane in which the perimeter of the primary waveguide lies.

2. The unit of claim 1, wherein the perimeter shape is an equilateral triangle, square, regular hexagon, or rectangle.

3. The unit of claim 1, wherein the perimeter shape is that of a polygon, the polygon having n edges, each edge having an edge length, wherein the edge length is from about 50 mm to about 250 mm.

4. The unit of claim 1, wherein the perimeter shape is that of a polygon having n edges, and the unit has a total of n photovoltaic cells, each photovoltaic cell having a primary absorption surface and each photovoltaic cell being operatively connected to an edge of the perimeter so that the plane of the primary absorption surface of the photovoltaic cell is substantially parallel to the plane in which the perimeter of the primary waveguide lies.

5. The unit of claim 1, wherein the first apex height is from about 15 mm to about 45 mm.

6. The unit of claim 1, wherein the primary waveguide is formed from a composition comprising a polymer and a fluorescent colorant selected from the group consisting of a dye, a pigment, and a quantum dot.

7. The unit of claim 1, wherein the primary waveguide has a thickness from 2 mm to 5 mm.

8. The unit of claim 1, wherein the unit further comprises a structural back sheet located closer to the perimeter of the primary waveguide than the apex of the primary waveguide.

9. The unit of claim 8, wherein the structural back sheet reflects light towards the primary waveguide.

10. The unit of claim 8, wherein the structural back sheet is configured to maintain a spaced distance between the photovoltaic cell and the perimeter of the primary waveguide.

11. A luminescent solar concentrator unit comprising:
a light concentrating substrate that has an index of refraction greater than that of the ambient atmosphere around the unit, a light receiving front surface, a back surface, and a light emitting perimeter, wherein the perimeter lies in a plane, the front surface and back surface maintain a fixed distance between each other, and the substrate is curved so that the front surface has a greater surface area than the back surface;
a plurality of photovoltaic cells, each cell located under the light emitting perimeter and oriented to present an absorption surface parallel to the plane defined by the perimeter; and
a back sheet configured to maintain the spatial relationship between the light concentrating substrate and each photovoltaic cell; wherein an angle of curvature between the intersection of the plane in which the perimeter lies and the surface of the primary waveguide is 15° to 45°.

12. The unit of claim 11, wherein the back sheet comprises a plurality of pockets, each pocket configured to maintain a spaced distance between a photovoltaic cell inside the pocket and the light emitting perimeter of the light concentrating substrate.

13. The unit of claim 11, wherein the back sheet further comprises a reflective surface to reflect light towards the light concentrating substrate.

14. The unit of claim 11, wherein the light emitting perimeter has the shape of a polygon.

15. A luminescent solar concentrator unit comprising a primary waveguide and a photovoltaic cell;
the primary waveguide defined by a convex curved surface connecting a perimeter and an apex, the perimeter forming a shape, and the apex located at a first apex height from a plane in which the perimeter lies and above the centroid of the perimeter shape;
wherein the photovoltaic cell has a primary absorption surface; and
wherein the primary absorption surface is operatively connected to at least a portion of the perimeter of the primary waveguide and the plane of the primary absorption surface is substantially parallel to the plane in which the perimeter of the primary waveguide lies;
wherein the primary waveguide further comprises an outside edge equalizer, the outside edge equalizer being operatively connected to a portion of the perimeter of the primary waveguide and defined by an equalizer surface which rises from the plane in which the perimeter lies to a second height which is less than the first apex height, extends outwards from the perimeter at the second height for an outside edge length, then descends to or below the plane in which the perimeter lies; the equalizer surface having the same thickness as the primary waveguide.

16. The unit of claim 15, wherein the perimeter shape is an equilateral triangle, square, regular hexagon, or rectangle.

17. The unit of claim 15, wherein the perimeter shape is that of a polygon, the polygon having n edges, each edge having an edge length, wherein the edge length is from about 50 mm to about 250 mm.

18. The unit of claim 15, wherein the perimeter shape is that of a polygon having n edges, and the unit has a total of n photovoltaic cells, each photovoltaic cell having a primary absorption surface and each photovoltaic cell being operatively connected to an edge of the perimeter so that the plane of the primary absorption surface of the photovoltaic cell is substantially parallel to the plane in which the perimeter of the primary waveguide lies.

19. The unit of claim 15, wherein the first apex height is from about 15 mm to about 45 mm.

20. The unit of claim 15, wherein the primary waveguide is formed from a composition comprising a polymer and a fluorescent colorant selected from the group consisting of a dye, a pigment, and a quantum dot.

21. The unit of claim 15, having an angle of curvature at the intersection of the plane in which the perimeter lies and the curved surface of the primary waveguide, wherein the angle of curvature is from 15° to 45°.

22. The unit of claim 15, wherein the primary waveguide has a thickness from 2 mm to 5 mm.

* * * * *